United States Patent [19]

Olson

[11] 4,123,705

[45] Oct. 31, 1978

[54] OSCILLOGRAPHIC APPARATUS FOR MEASURING THE MAGNITUDE AND DURATION AND FOR SEPARATELY VIEWING AN INPUT SIGNAL

[75] Inventor: Ronald Arthur Olson, Portland, Oreg.

[73] Assignee: Tektronix, Inc., Beaverton, Oreg.

[21] Appl. No.: 804,827

[22] Filed: Jun. 8, 1977

Related U.S. Application Data

[63] Continuation of Ser. No. 634,818, Nov. 24, 1975, abandoned, which is a continuation of Ser. No. 503,199, Sep. 4, 1974, abandoned.

[51] Int. Cl.$^2$ .................... G01R 13/20; H01J 29/70
[52] U.S. Cl. ................................ 324/121 R; 315/364; 328/147; 358/10
[58] Field of Search ................... 324/121 R, 77 A, 88; 315/364, 395, 409, 391–394, 396–398, 379–386; 328/147, 187; 307/354, 358, 364; 358/10

[56] References Cited

U.S. PATENT DOCUMENTS 3,449,671  6/1969  Long .................................. 324/121

*Primary Examiner*—Rudolph V. Rolinec
*Assistant Examiner*—Ernest F. Karlsen
*Attorney, Agent, or Firm*—Adrian J. La Rue

[57] ABSTRACT

An oscilloscope includes means for intermittently or periodically adding electrical values to the horizontal and vertical deflection signals thereby producing a convenient juxtaposition or superposition of selectable portions of an input signal.

4 Claims, 3 Drawing Figures

OSCILLOGRAPHIC APPARATUS FOR MEASURING THE MAGNITUDE AND DURATION AND FOR SEPARATELY VIEWING AN INPUT SIGNAL

CROSS REFERENCE TO RELATED APPLICATIONS

This application is a continuation of application Ser. No. 634,818 filed Nov. 24, 1975 now abandoned, which in turn, is a continuation of application Ser. No. 503,199 filed Sept. 4, 1974 now abandoned.

BACKGROUND OF INVENTION

An oscillographic apparatus, either of the type comprising a direct viewing oscilloscope or of the recording type, is useful not only in displaying the waveform of an electrical input signal, but also in measuring the magnitude and duration thereof. Such an apparatus includes vertical deflection means for producing the magnitude dimension of the display in accordance with the magnitude of the input signal. Furthermore, as is well known, a horizontal deflection means for producing the length dimension of the display in accordance with and indicative of the duration of the input signal is also provided. Upon each recurrence of an input signal, the horizontal and vertical deflection means causes the cathode-ray-tube's electron beams to trace the characteristic waveform shape of the electrical input signal on the cathode-ray-tube screen. It is also well known to observe and compare in some detail separate parts of the electrical input signal, such as for example, to display and compare separate vertical synchronization signals or the like as employed in television transmission. In this instance the oscillographic apparatus would include means for periodically adding electrical values to the vertical and horizontal deflection means to produce first and second displays of the input signal, then at times corresponding to the production of the second display, delay the horizontal deflection means an adjustable amount so that the second display depicts a portion of the input signal at a time different from the first display in order that signal portions can be compared with one another.

It is often desirable however, to observe and compare in some detail separate parts of an electric input signal not necessarily a repetitive signal. Thus, a disadvantage of the prior art is that the electrical input signal must be a successive waveform or that some completed form of double-triggering must be used. Typical apparatus according to the prior art are fully described in U.S. Pat. Nos. 3,449,671 and 3,457,505 of Gordon D. Long and Philip S. Crosby respectively, which are assigned to the assignee of the present invention.

SUMMARY OF THE INVENTION

In accordance with the embodiment of the present invention, an oscillographic instrument such as an oscilloscope, for displaying an input waveform, is provided with means for initiating a sweep waveform by a gating waveform. The sweep waveform is time related to the waveform to be observed. A delayed gate is derived from the sweep waveform; the delay ranging over the sweep time. Various amplitudes of the gate waveform are then applied to the vertical and horizontal deflection means to produce a vertical shift of part of the input waveform and a horizontal (time) shift of the same part of the input waveform.

It is therefore an object of the present invention to provide an oscillographic apparatus for displaying different events from a non-recurrent electrical input signal.

It is another object of the present invention to provide an oscillographic apparatus for portraying different events that are non-recurring.

It is yet another object of the present invention to provide an oscillographic apparatus for displaying of one part of a waveform juxtaposition upon another part of the waveform.

The foregoing and numerous other objects, advantages, and inherent functions of the present invention will become apparent as the same is more fully understood from the following description, which describes the preferred embodiment of the invention; it is to be understood, however, that this embodiment is not intended to be exhausting nor limiting of the invention but is given for purposes of illustration in order that others skilled in the art may fully understand the invention and principles thereof and the manner of applying it in practical use so that they may modify it in various forms, each as may be best suited to the conditions of the particular use.

DESCRIPTION OF INVENTION

Figure 1:
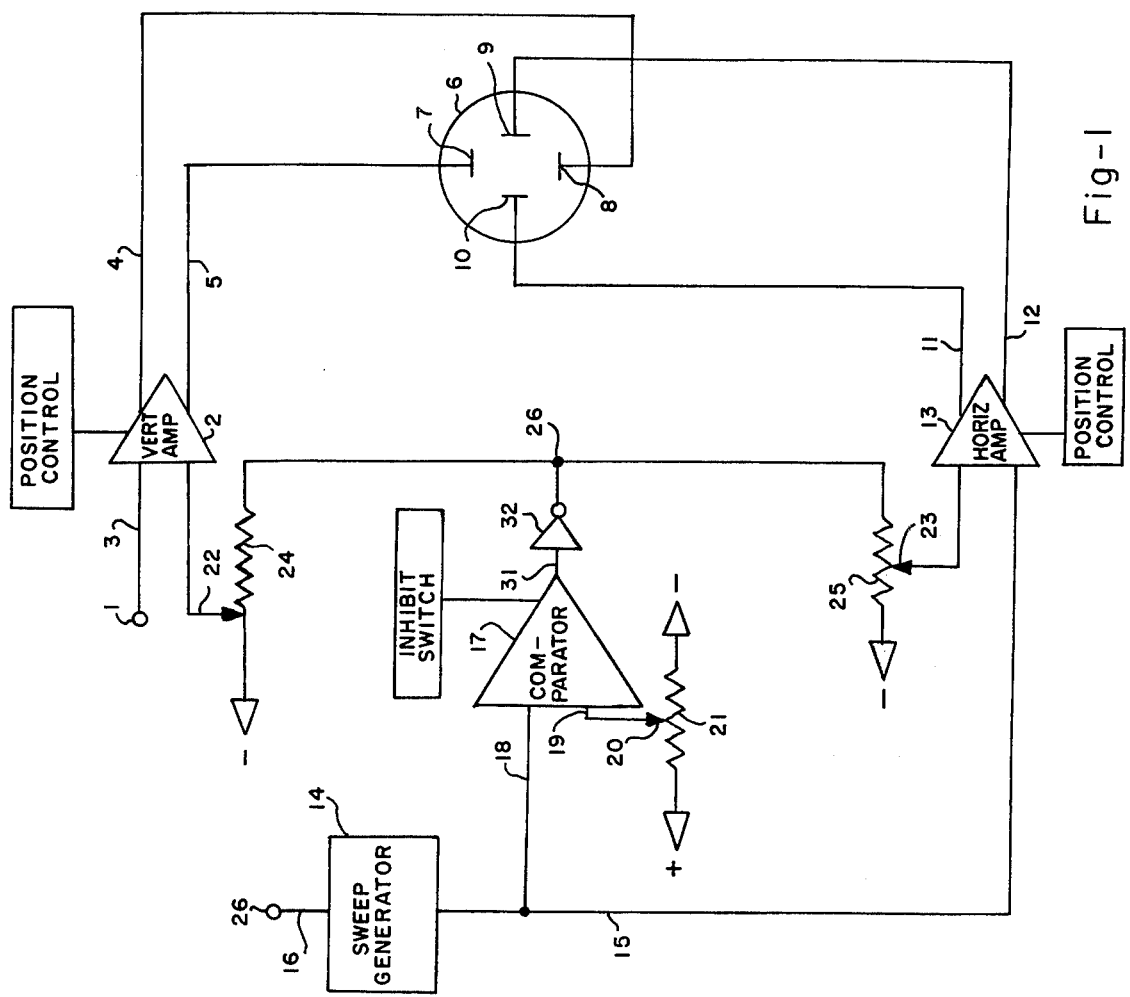
FIG. 1 is a schematic diagram of an oscillographic apparatus according to the present invention.

Referring now to the drawings, and in particular to FIG. 1, an input signal in the form of a recurring or non-recurring waveform is applied via input terminal 1 to a vertical amplifier 2 by way of the lead 3. The vertical amplifier 2 forms part of the vertical deflection means in the oscillographic apparatus, and provides a vertical deflection waveform output at 4, 5 for application to a display means 6, for example, for application to the vertical deflection plates 7, 8 in a cathode-ray-tube. As is well known, the waveform output at 4, 5 applied to the vertical deflection plates 7, 8 causes corresponding instantaneous positioning of the electron beam in the cathode-ray-tube 6 and as such comprises a substantial portion of the vertical deflection system in the oscillographic apparatus for determining the amplitude of the display in accordance with the instantaneous amplitude of the input signal waveform.

Horizontal deflection plates 9, 10 of the display means 6 receive the waveform output at 11, 12 which is provided by the horizontal amplifier 13. Thus, the horizontal amplifier 13 drives horizontal deflection plates 9, 10 whereby the cathode-ray-tube's electron beam is caused to scan in a horizontal direction for production of the time dimension of the display. The waveform output at 11, 12 provided by horizontal amplifier 13 is a linear ramp deflection signal having a duration equalling the period of operation of the sweep generator 14 from which it is derived and applied via the lead 15. Applied to sweep generator 14 by way of the lead 16 at an input 26 is a gating signal in the form of a recurring or non-recurring gating waveform. As is well known, the sweep generator 14 is sensitive to various characteristics and parameters of the gating waveform (i.e., slope, level, etc.) and provides the linear ramp deflection signal having a duration equalling each occurance of the gating waveform. As such, a substantial portion of the horizontal deflection system in the oscillographic apparatus for determining the length dimension of the display is provided, such system being a sweep time base.

In accordance with the present invention the linear ramp deflection signal derived by the sweep generator 14 is also applied to a comparator 17 by way of the lead 18. Also, applied to comparator 17 by way of the lead 19 is a comparison voltage derived from a voltage divider or similar means. The comparison voltage is adjustably provided at the tap 20 of a potentiometer 21 connected between a source of suitable electric potential, such potential labeled +,— in FIG. 1 for explanation purposes only. Tap 20 provides an input to the comparator which causes comparator 17 to provide a comparison waveform on the lead 31 in the form of a delayed gating waveform, such delayed gating waveform being adjustable in accordance with the comparison voltage adjustably provided at the tap 20. The delayed gating waveform on the lead 31 is inverted by inverter 32 and is adjustably applied to second inputs of vertical amplifier 2 and horizontal amplifier 13 via taps 22, 23 of potentiometers 24, 25 respectively, disposed between a common point 26 and a source of suitable electrical potential and shown as — in FIG. 1 for explanation purposes only. As can be discerned, various amplitudes of the delayed gate waveform are applied to the vertical and horizontal amplifiers to produce a vertical shift of part of the input signal applied via input terminal 1 and/or a horizontal time shift of that same part of the input signal applied via the terminal 1.

Figure 2:
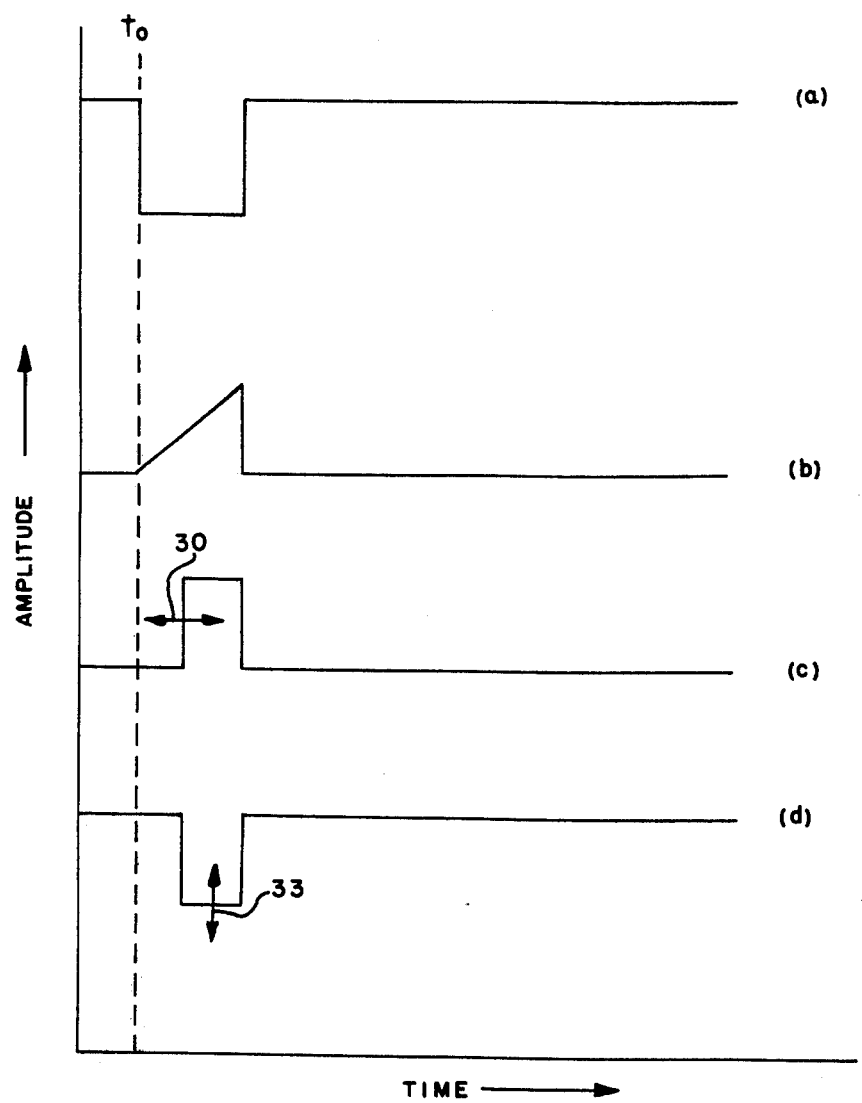
FIG. 2 is a chart of waveforms illustrating the operation of the FIG. 1 embodiment.

Referring now to FIG. 2, there is shown a chart of waveforms illustrating operation of the FIG. 1 embodiment. The waveforms are time related and plotted on the conventional Cartesian coordinate system; amplitude on the ordinate axis and time on the abscissa. The waveforms represent operation when a non-recurring waveform is applied to the vertical amplifier. Waveform (a) depicts a gating signal applied to sweep generator 14 by way of the lead 16 at input 26. As is well known, gating signal (a) is derived from the waveform applied to the vertical amplifier. For example, if the electrical input signal defined a television electrical signal having a waveform which is well defined, such gating signal (a) might be derived form the sync pulse of the waveform. The gating waveform (a) is used to initiate the waveform (b) by causing sweep generator 14 to generate the linear ramp deflection signal waveform (b). As can be discerned from the drawing, such waveform (b) has a duration equalling the occurance of the gating waveform. As is well know, the linear ramp determines the length dimension of the display provided. The linear ramp deflection signal waveform (b) is then compared with a comparison voltage by comparator 17. Comparator 17, in turn, provides the delayed gating waveform (c) on the lead 31. As comparator 17 also receives an adjustable comparison voltage provided at the tap 20 of potentiometer 21, the delayed gating waveform is adjustable in the direction of double-headed arrow 30. As the operation of a comparator is well known to those in the art, no discussion thereof will be made. Although not shown in detail, provisions such as a switch, etc., can be connected to the comparator 17 to inhibit such during the display of, say, a conventional recurring input signal. Additionally, in the preferred embodiment of the present invention, sweep generator 14 and comparator 17 are a single unit in the form of an integrated circuit but as such should not be interpreted to exclude discrete component type stages.

After inversion by inverter 32, the delayed gating waveform (c) becomes the waveform (d) which is adjustably applied to the second inputs of the vertical and horizontal amplifiers. As shown in the FIG. 2 drawing, the waveform (d) is adjustable in the direction of double headed arrow 33. Thus, various amplitudes of the inverted delayed gate can produce a vertical shift of part of the input waveform and a horizontal (time) shift of the same part of the input waveform.

Figure 3:
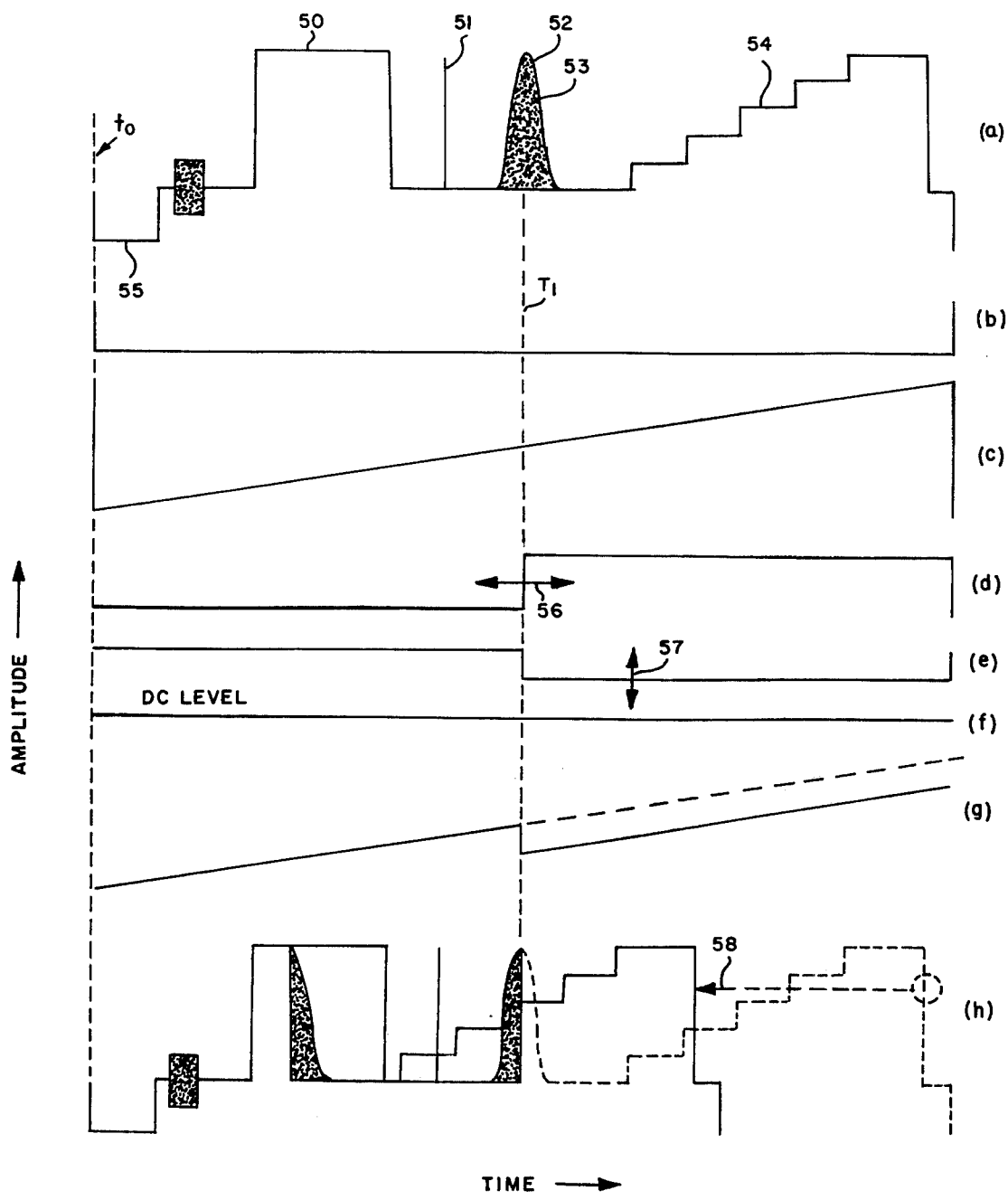
FIG. 3 is a chart of waveforms illustrating the manner of employment of the FIG. 1 embodiment.

Referring to FIG. 3, there is shown a chart of waveforms illustrating the manner of employment of the FIG. 1 embodiment. The waveform (a) is, for example, a conventional vertical insertion test signal inserted into the vertical interval during a selected line and field of a composite video signal. The test signal is non-recurring and includes a bar portion 50 of specified amplitude, a pulse 51 of specified amplitude, a modulated pulse 52 including modulation 53, and a staircase portion 54 of various specified amplitudes. This vertical insertion test signal thus becomes the input signal waveform applied via input terminal 1 (see FIG. 1) to the vertical amplifier 2 by way of the lead 3. Waveform (b), the gating waveform is derived from the sync pulse portion 55 of the waveform (a) at a time $t_o$ using conventional techniques. Although shown as a single line i.e., approximately 64 $\mu$sec for a conventional composite video signal such gating waveform may be more than, or less than the time of one line depending upon the application desired. For example, two lines in length to provide juxtaposition of certain portions of the display and compare adjacent line displays etc. Gating waveform (b) initiates the waveform (c) which, in turn, is generated by sweep generator 14. Waveform (c) is the linear ramp deflection signal having a duration equalling the occurance of the gating waveform (b) and having an amplitude of sufficient magnitude to cause the display device electron beams to produce a full display and is applied to comparator 17 by way of the lead 18.

Waveform (d) represents the delayed gating waveform on the lead 31 and changes states at a time, say, $t_1$. As previously stated, such waveform is adjustably positioned in the direction of the double headed arrow 56 dependent upon the setting of tap 20. In the preferred embodiment, such waveform is adjustable across the entire line by providing an electric potential across the potentiometer 21 so that such potential magnitude equals the magnitude of the waveform (c). Waveform (e) represents the inverted delayed gating waveform which is adjustably provided in the direction of double headed arrow 57 to the second input of horizontal amplifier 13 via tap 23 of potentiometers 25, whereas the waveform (f) represents the inverted delayed gating waveform applied to vertical amplifier 2 via tap 22 of potentiometer 24 when in position as shown in FIG. 1. Under most operating conditions, no offset of the vertical amplifier would be desired. Waveform (g) represents the waveform now applied to the horizontal deflection plates of the display means via the horizontal amplifier 13. As can be discerned from the drawing, the amplitude of the delayed gating waveform (e) in the direction of the double headed arrow 57 offsets the linear ramp a proportional amount, then continues at the same rate until termination of the sweep. The result of such technique is shown by the waveform (h) which represents the magnitude dimension and length dimension of the display as provided on display device 6 by deflecting the cathode-ray-tube's electron beams in accordance therewith. As can be discerned from the waveform (h) the input signal waveform (a) has been displayed normally from the time $t_o$ to $t_1$. At time $t_1$, the remaining portion of the normal display (indicated by a dashed waveform) has been shifted in the direction of the arrow 58 a distance dependent upon the amplitude of waveform (e) adjustably applied to the horizontal amplifier 13. Thus, the modulated pulse portion 52 and bar portion 50 amplitudes are superposed or "slid-back" so that comparison therebetween can be made. If it were desired, say to compare a particular step portion 54 with the bar portion 50, tap 20 of potentiometer 21 would be adjusted to compare the waveform (c) later in time, then taps 22, 23 of potentiometers 24, 25 respectively, would be adjusted for the desired comparison and comparison voltages then read out on calibrated dials, such being portions of the potentiometers.

Throughout the description, no mention of the particular circuits for the sweep generator, comparator, amplifiers and display devices have been discussed. Each of the stages are well known and most are fully described in the aforementioned patents, or are deemed obvious, such as for example, the position controls associated with the vertical and horizontal amplifiers. An exception could possibly be the inhibit switch associated with comparator 17 for selectively operating the apparatus in accordance with either the prior art or the present invention. The inhibit switch can be either electrical or mechanical and need only inhibit comparator 17 from producing an output waveform on the lead 31.

While there has been shown and described the preferred embodiment of the present invention, it will be apparent to those skilled in the art that many changes and modifications may be made without departing from the invention in its broader aspects. Therefore, the appended claims are intended to cover all such changes and modifications that fall within the true spirit and scope of the invention.

The invention is claimed in accordance with the following:

1. An improved oscillographic instrument for providing a display of an input waveform applied thereto, the instrument of the type which includes deflection means for generating a deflection signal in accordance with the instantaneous amplitude of the input waveform for determining the amplitude of the display and for generating a deflection signal for providing a time base sweep, and also including electric means for causing substantially instantaneous amplitude changes in the deflection signals produced by the deflection means, the improvement comprising:

means for selectively comparing the time base sweep to a reference value for providing calibrated electrical values for application to the electric means whereby the instrument will provide a display of recurring and non-recurring input waveforms applied thereto.

2. The instrument according to claim 1 wherein the improvement further comprises:

comparator means for receiving the time base sweep and a reference signal for providing a variable gate signal; and means for variably supplying said variable gate signal to the deflection means to selectively display the input waveform.

3. An oscillographic instrument for providing a display of an input waveform, comprising:

vertical deflection means for generating a deflection signal in accordance with the instantaneous amplitude of the input waveform for determining the amplitude of the display;

horizontal deflection means generating a horizontal deflection signal for providing a time base sweep;

means for selectively comparing said time base sweep to a reference value for providing calibrated electrical values; and means for adding said calibrated electrical values to said vertical deflection signal or said horizontal deflection signal or both said vertical and horizontal deflection signals for causing substantially instantaneous amplitude changes in said deflection signals to provide a display of recurring and non-recurring input waveforms.

4. A method for displaying an input waveform on an oscillographic instrument having a display means, comprising:

providing vertical deflection means for generating a deflection signal in accordance with the instantaneous amplitude of the input waveform for determining the amplitude of the display;

providing horizontal deflection means generating a horizontal deflection signal for providing a time base sweep;

providing means for selectively comparing said time base sweep to a reference value for providing calibrated electrical values; and providing means for adding said calibrated electrical values to said vertical and horizontal deflection signals for causing substantially instantaneous amplitude changes in said deflection signals to provide a display of recurring and non-recurring input waveforms.

* * * * *